United States Patent [19]

McIntyre

[11] Patent Number: 4,972,242

[45] Date of Patent: Nov. 20, 1990

[54] SILICON AVALANCHE PHOTODIODE WITH LOW MULTIPLICATION NOISE

[75] Inventor: Robert J. McIntyre, Pointe Claire, Canada

[73] Assignee: RCA Inc., Vaudreuil, Canada

[21] Appl. No.: 418,608

[22] Filed: Oct. 10, 1989

[30] Foreign Application Priority Data

Jan. 12, 1989 [CA] Canada .................................. 588060

[51] Int. Cl.$^5$ .......................................... H01L 27/14
[52] U.S. Cl. .......................................... 357/30; 357/55; 357/52; 357/58
[58] Field of Search ................. 357/30 A, 30 P, 30 L, 357/30 Q, 55, 13, 52, 52 D, 58

[56] References Cited

U.S. PATENT DOCUMENTS

| | | | |
|---|---|---|---|
| 3,886,579 | 5/1975 | Ohuchi et al. | 357/13 |
| 4,127,932 | 12/1978 | Hartman et al. | 29/590 |
| 4,129,878 | 12/1978 | Webb | 357/13 |
| 4,383,267 | 5/1983 | Webb | 357/30 |
| 4,463,368 | 7/1984 | McIntyre et al. | 357/30 |
| 4,654,678 | 3/1987 | Lightstone et al. | 357/30 A X |

FOREIGN PATENT DOCUMENTS 076143 6/1983 European Pat. Off. .

OTHER PUBLICATIONS

"Properties of Avalanche Photodiodes" by Webb et al; RCA Review, vol. 35, pp. 234-278, Jun. 1974.

Ruegg, "An Optimized Avalanche Photodiode," *IEEE Transactions on Electron Devices*, vol. ED-14, No. 5, May 1967, pp. 239-246.

Lucas, "Detectors for Fibre-Optic Communication," *Proc. IEE*, vol. 123, No. 6, Jun. 1976, pp. 623-626.

Kanedo et al, "Low Noise Avalanche Photodiodes by Channeling of 800-KeV Boron into <110> Silicon," *J. Appl. Phys.* 49(12), Dec. 1978, pp. 6199-6200.

Melchior et al, "Epitaxial Silicon n+-p-$\pi$-p+ Avalanche Photodiodes for Optical Fiber Communications at 800 to 900 Nanometers," *Conference: Electron Devices Meeting (Technical Digest)*, Washington, D.C., U.S.A., (6-8 Dec. 1976), pp. 412-415.

*Primary Examiner*—William Mintel
*Attorney, Agent, or Firm*—Raymond A. Eckersley

[57] ABSTRACT

There is provided an n+-p-$\pi$-p+ APD having a shallow and abrupt p-n junction located about 1 to 2 $\mu$m into the APD and having a p-type conductivity region containing acceptors in an uncompensated excess concentration corresponding to a dose of between about 5 and $10 \times 10^{11}$ acceptors/cm$^2$. The combination of the shallow p-n junction and the doping profile in the p-type concentration region gives rise to an electric field profile having multiplication spread substantially throughout the entire thickness of the central active region of the APD and having no drift region. The electric field profile peaks adjacent the p-n junction in a value of about $2.9 \times 10^5$ volts/cm. The electric field profile diminishes over the distance that the p-type conductivity region extends into the APD but remains at about $1.6 \times 10^5$ volts/cm to maintain multiplication throughout the thickness of the active region of the APD. The thickness of the APD and the multiplication region extending through the APD can be achieved with an acceptable increase in operating voltage provided that the APD has a thickness less than about 40 $\mu$m.

22 Claims, 2 Drawing Sheets

SILICON AVALANCHE PHOTODIODE WITH LOW MULTIPLICATION NOISE

The invention relates to an improved avalanche photodiode and, in particular, to an avalanche photodiode having a reduced $k_{eff}$.

BACKGROUND OF THE INVENTION

An $n^+$-p-$\pi$-$p^+$ avalanche photodiode (APD) comprises a body of $\pi$-type conductivity silicon (Si) having an n-type conductivity region extending a distance into the body from a portion of a first surface thereof with a p-type conductivity region extending a further distance into the body from the n-type region, and a p-n junction therebetween. A $p^+$-type conductivity region extends a distance into the body from a surface opposed to the first surface. Electrical contact is made to the $n^+$- and $p^+$-type regions.

In the operation of this APD, a reverse bias is applied to the electrical contacts producing an electric field within the APD whose profile depends upon the impurity concentration in the different regions and which forms a depletion region typically reaching through the $\pi$-type region. Light incident on the surface containing the $p^+$-type region enters the photodiode and is absorbed primarily in the $\pi$- or p-type regions, generating electron-hole pairs. The electrons are accelerated by the electric field until they attain sufficient energy for multiplication which typically occurs within one to three micrometers ($\mu$m) of the p-n junction. Holes generated within the high field region are accelerated in the opposite direction and can also undergo multiplication where the electric field is sufficiently high.

One of the limitations of such an APD is that the multiplication process is noisy due to the width of the probability distribution of gains that a carrier can undergo. Webb et al, in RCA Review 35, 234 (1974) disclose that, to a good approximation, the excess noise factor F, defined as $F=<M^2>/<M>^2$, can be expressed by $$F = k_{eff}<M> + (1-k_{eff})(2-1/<M>)$$

where $k_{eff}$ is a weighted average of the ratio of the hole ionization coefficient to the electron ionization coefficient, $<M>$ is the average avalanche gain, and $<M^2>$ is the average value of the square of the gain. For a Si APD a typical value for $k_{eff}$ is between about 0.015 and about 0.1 and depends strongly upon both the electric field and its profile. To minimize the excess noise, $k_{eff}$ must be as low as possible; i.e., the hole multiplication must be minimized and the electron multiplication must be maximized. Because the ratio of the ionization coefficients decreases with decreasing electric field, the electric field should be large where the electron current is highest and hole current is lowest while the field should be small where the hole current is highest.

U.S. Pat. No. 4,463,368 issued to McIntyre et al on July 31, 1984 discloses an APD structure having a low value of $k_{eff}$ in the order of 0.006 to 0.008. This patent discloses an $n^+$-p-$\pi$-hu $+$APD having an $n^+$-type region extending into the $\pi$-type Si body a distance less than about 10 $\mu$m and a p-type region containing acceptors in an uncompensated excess concentration corresponding to a dose of between about $1\times10^{12}$ and about $3\times10^{12}$ acceptors/cm$^2$ of the surface area of the body into which the acceptors are introduced and extending into the body a distance in an APD where the multiplication occurs primarily at one end of a fully-depleted structure leaving a drift region at the other end in which the electric field is adequate only for rapid charge collection and does not contribute to the multiplication process. This APD is typically in the order of 100 $\mu$m in thickness and the p-type impurity concentration region is diffused into the APD a distance of about 30 to 40% of the total thickness of the APD.

SUMMARY OF THE INVENTION

It is an object of the present invention to provide an APD device having a $k_{eff}$ lower than that previously obtainable while still maintaining the diode voltage at a value adequately low so that long-term reliability is not adversely affected.

Briefly, the present invention provides for an $n^+$-p-$\pi$-$p^+$ APD having a shallow and abrupt p-n junction located about 1 to 2 $\mu$m into the APD and having a p-type conductivity region containing acceptors in an uncompensated excess concentration corresponding to a dose of between about $5\times10^{11}$ and $10^{12}$ acceptors/cm$^2$. The combination of the shallow p-n junction and the doping profile in the p-type concentration region gives rise to an electric field profile having multiplication spread substantially throughout the entire thickness of the central active region of the APD region. At room temperature, the electric field profile peaks at the p-n junction in a value in the order of 2.5 to $3.5\times10^5$ volts/cm and which value is preferably about $2.9\times10^5$ volts/cm. The electric field profile diminishes over the distance that the p-type conductivity region extends into the APD but remains at a value sufficient to maintain multiplication throughout the thickness of the APD. This latter value is preferably about $1.6\times10^5$ volts/cm at room temperature. The thickness of the APD and the multiplication region extending through the APD can be achieved without an unacceptably large increase in operating voltage provided that the APD has a thickness less than about 40 $\mu$m.

To provide the optimum electric field profile where multiplication is spread throughout the thickness of the APD, a one-step implantation of an acceptor impurity, such as boron, of total dose $n_{ai}$ (after diffusion, and allowing for out-diffusion, if such occurs) may be used so as to give a p-type doping concentration of the approximate form:

$$N_a(x) = N_{ao} + \frac{n_{ai}\exp[-x^2/4L_a^2]}{\pi^{\frac{1}{2}}L_a}$$

where $N_{ao}$ is the net ionized impurity doping level of the starting material (typically, but not necessarily, about 2 to $5\times10^{12}$/cm$^3$), $n_{ai}$ is the net implanted dose (in the order of $5\times10^{11}$ to $10^{12}$/cm$^2$ and preferably $7\times10^{11}$ to $9\times10^{11}$/cm$^2$) and $L_a$ is the diffusion length of the implanted acceptor impurity ($L_a$ is in the order of 2 to $10\times10^{-4}$ cm, and preferably about 4 to $6\times10^{-4}$ cm).

Therefore, in accordance with one aspect of the present invention there is provided an avalanche photodiode comprising:

a $\pi$-type conductivity silicon body having a pair of opposed major surfaces:

an n-type conductivity central region extending a distance of about 1 to 2 $\mu$m into the body from a portion of a first major surface thereof;

an n-type conductivity guard ring surrounding the central region and extending into the body a distance greater than that of the distance the central region extends into the body;

a p-type conductivity region contacting the n-type region, extending into the body a distance of about 10 to 50 μm or to a second major surface opposite the first surface when the thickness of the body is less than 50 μm, and containing acceptors in an uncompensated, excess concentration corresponding to a net implanted dose of between about $5\times10^{11}$ and about $10^{12}/cm^2$ of surface area through which the acceptors enter the body; and a p$^+$-type conductivity region extending a distance into the body from the second major surface.

In one embodiment it is envisaged that the guard ring is diffused into the body about 5 to 10 μm to prevent edge breakdown occurring at the periphery of the p-n junction thereby ensuring that multiplication and breakdown occur primarily in the central active region. In this embodiment the photodiode includes a well etched from the second major surface of the photodiode so that the thickness of the photodiode at the well through the active region is less than about 40 μm and is preferably in the order of 15 to 30 μm in thickness.

In another embodiment, the overall thickness of the photodiode is in the order of 40 μm or less and is preferably in the order of 15 to 30 μm.

In accordance with another aspect of the present invention there is provided an avalanche photodiode comprising:

a π-type conductivity silicon body having a pair of opposed major surfaces;

an n-type conductivity central region extending into the body from a portion of a first major surface thereof and contacting a p-type conductivity region to form a abrupt p-n junction about 1 to 2 μm into the body, an n-type conductivity guard ring surrounding the n-type central region and extending a distance beyond the distance that the central region extends into the body to prevent edge breakdown at the p-n junction;

the p-type conductivity region containing acceptors in an uncompensated, excess doping concentration of the form:

$$N_a(x) = N_{ao} + \frac{n_{ai}\exp[-x^2/4L_a^2]}{\pi^{\frac{1}{2}}L_a}$$

where $N_{ao}$ is the net ionized impurity doping level of the starting material and is in the order of about 2 to $5\times10^{12}/cm^3$, $n_{ai}$ is the net implanted concentration dose and is between $5\times10^{11}$ and $10^{12}/cm^2$ of surface area through which the acceptors enter the body, and $L_a$ is the average diffusion length of the implanted acceptor impurity into the body and is between about 2 and 10 μm; and, a p$^+$-type conductivity region extending a distance into the body from a second major surface opposite to the first surface.

In one embodiment it is envisaged that $n_{ai}$ is about 7 to $9\times10^{11}/cm^2$. In this embodiment it is also contemplated that the average diffusion length of implanted acceptor impurity (La) into the body is about 4 to $6\times10^{-4}$ cm.

BRIEF DESCRIPTION OF THE DRAWINGS

For a better understanding of the nature and objects of the present invention reference may be had by way of example to the accompanying diagrammatic drawings in which.

DETAILED DESCRIPTION OF THE PREFERRED EMBODIMENTS

Figure 1:
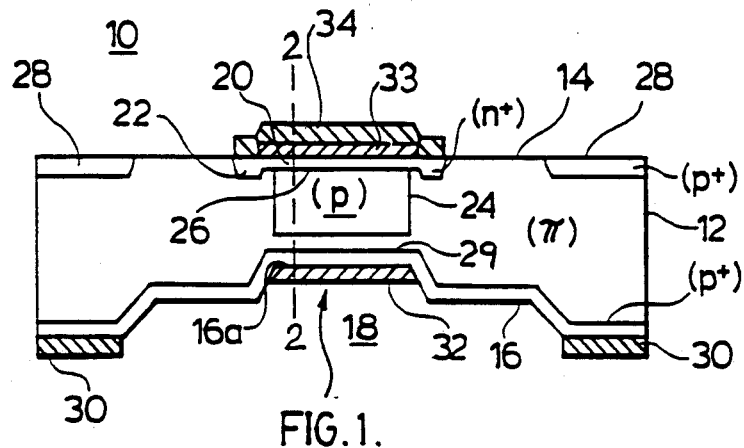
FIG. 1 is a cross-sectional view of one embodiment of the improved APD of the present invention.

Referring to FIG. 1 there is shown an n$^+$-p-π-p$^+$reach through APD 10 (RAPD). APD 10 includes a body 12 of π-type conductivity Si having opposed major surfaces 14 and 16. Surface 16 has a well 18 etched therein providing a central surface portion 16a at the base of well 18.

An n$^+$-type conductivity central region 20 extends a distance into the body 12 from the surface 14 and is surrounded by an n$^+$-type conductivity guard ring 22 extending a further distance into the body 12 from the surface 14. The n$^+$-type central region typically extends about 1 to 2 μm into the body and is a relatively shallow compared to the n$^+$-type guard ring which extends in the order of 5 to 10 μm into the body. The central and guard ring n$^+$-type regions may be obtained by using two different diffusion times, or by a simultaneous diffusion using two different doping species, such as phosphorus in the guard ring and arsenic in the central region. The purpose of the guard ring is to prevent the occurrence of edge breakdown at the p-n junction periphery at a voltage lower than that for which breakdown occurs in the active region.

The APD includes a p-type conductivity region 24 extending a further distance into the body 12 than the n$^+$central region thereby forming a p-n junction 26 at the intersection of the n+- and p-type regions 20 and 24 respectively. The doping profile of this region in combination with the relatively shallow p-n junction results in an electric field profile for the APD 10 having a multiplication region spread through the active region of the device. The doping profile of the p-type conductivity region 24 and its effect on the electric field is discussed in more detail hereinafter.

A p-type conductivity channel stop 28 containing an excess concentration of acceptors, preferably boron (B), extends a distance of several micrometers or more into the body 12 from the surface 14 and about the perimeter of, but does not contact, the n+-type guard ring 22. The purpose of the p$^+$channel stop 26 is to prevent the extension of the n-type inversion layer, which normally forms under the passivating oxide (not shown in FIG. 1) on the π surface, from reaching the edge of the device. The surface concentration of the p$^+$channel stop 26 layer should be $>10^{18}/cm^3$, particularly if the device is to be used in a high radiation environment. The depth of the channel stop 26 however, is fairly arbitrary.

A p$^+$-type conductivity region 29 extends a distance of about 1 μm into the opposed central surface portion 16a of the body 12.

An electrical contact 30 overlies a portion of the surface 16 and provides electrical contact to the p$^+$-type region 29. An antireflection coating 33 overlies the central portion 16a of the surface 16 through which light enters the body 12.

The electrical contact for the surface 14 providing electrical contact with the n+-type central region and guard ring includes a first metal 32 of Aluminum providing a good reflector that extends the quantum efficiency for those wavelengths which are not fully absorbed during one pass of the active region. Experience has shown, however, that this layer does not adhere well to silicon and, accordingly, the electrical contact further includes a second multi-layer metal 34 overlying the first metal. The first layer of the multi-layer metal 34 comprises chrome and makes contact in an area where avalanche gain is low. The second layer of the multi-layered second metal 34 comprises gold and is the layer to which the leads for the APD are bonded. It should be understood that any of several other suitable contact metallizations commonly used in the industry could be used in place of the metals specifically referred to herein.

Figure 2:
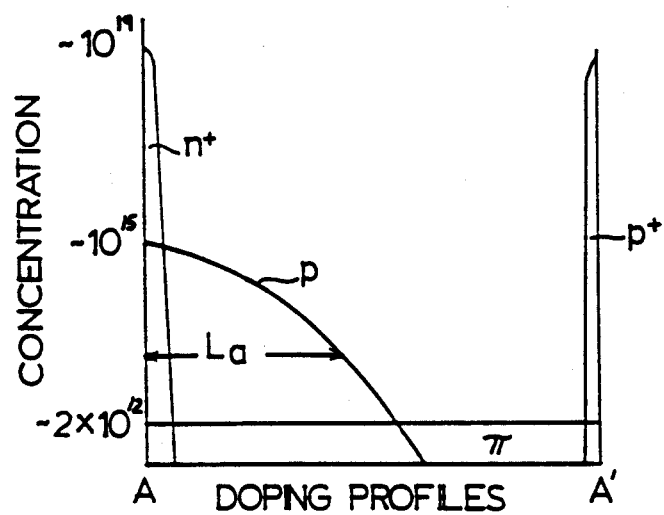
FIG. 2 is a section taken along lines 2—2 showing the geometry and doping profiles.

FIG. 2 illustrates the log concentrations for the impurity doping profiles for the various conductivity regions present in the APD of FIG. 1 along section line 2—2. The objective of the doping profile of the present invention is to provide an APD in which the electric field is optimized to give the lowest value of $k_{eff}$ for a given value of applied voltage. The result is an electric field which is high enough everywhere in the depletion layer to give some multiplication everywhere. Light entering the device at surface portion 16a is absorbed close to the p+-type conductivity region near this surface portion and generates electrons which are multiplied as they proceed to the anode (n+ surface area of central region 20). In the low-field portion of the diode, the electron ionization coefficient is about three orders of magnitude higher than that of holes, thus ensuring that hole multiplication is improbable in the regions where the hole current is high. Higher fields, and therefore higher hole ionization probabilities can be tolerated in regions where the hole current is low. As a result, the properly weighted ratio of hole ionization to electron ionization is kept low and hence a lower $k_{eff}$ is obtained. APD's made in accordance with the teachings of the present invention have been built and tested and have a value for $k_{eff}$ as low as 0.002 which is about a factor of 3 times better than previously obtained values of $k_{eff}$.

In order to obtain the optimum electric field profile and minimize the value of $k_{eff}$, for a given thickness across the active region of the APD the required doping profile to give precisely the optimum field distribution is not one that is easily achievable by standard doping techniques. However, the general form of the optimum electric field profile is similar to that shown as curve 44 in FIG. 3, and a field profile can be achieved using a one-step implantation of total dose $n_{ai}$ (after diffusion, and allowing for out-diffusion, if such occurs) so as to give a p-type doping concentration of the form:

$$N_a(x) = N_{ao} + \frac{n_{ai}\exp[-x^2/4L_a^2]}{\pi^{\frac{1}{2}}L_a}$$

where $N_{ao}$ is the net ionized impurity doping level of the starting material (typically, but not necessarily, about 2 to $5 \times 10^{12}/cm^3$), $n_{ai}$ implanted dose ($5 \times 10^{11}$ to $10^{12}/cm^2$ and preferably $7 \times 10^{11}$ to $9 \times 10^{11}/cm^2$) and $L_a$ is the average diffusion length of the implanted acceptor impurity ($L_a = 2 \times 10^{-4}$ to $10^{-3}$ cm, and preferably about 4 to $6 \times 10^{-4}$ cm). The range for the average diffusion length La of the implanted acceptor impurity into the body results in the p-type conductivity region extending about 5 times $L_a$, or to the opposite surface, whichever is less, into the body which body has a thickness of less than 40 μm and preferably 15 to 30 μm.

Figure 3:
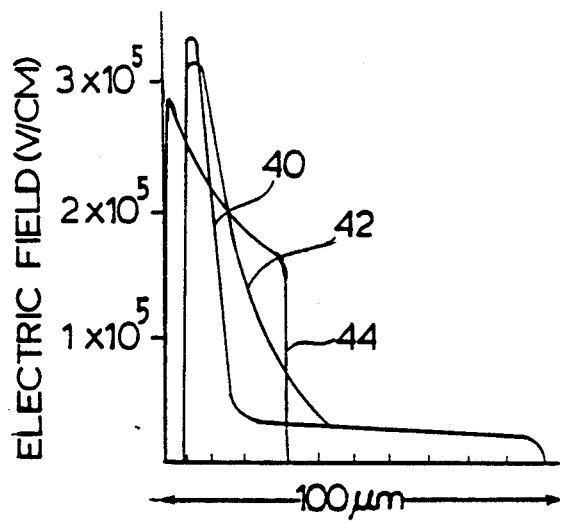
FIG. 3 is a view of the electric field profile for the present invention in comparison with previously obtained APD electrical field profiles; and, FIG. 4 is a cross-section view of another embodiment of the improved APD of the present invention.

FIG. 3 is a comparison of the electric field profiles for various reach through APD's taken along a section line 2—2 through the active region of the APD, similar to line 2—2 in FIG. 1. Curve 40 represents an electric field profile for a normal reach-through APD and curve 42 represents the electric field profile for a low $k_{eff}$ APD made in accordance with the teachings of the aforementioned McIntyre et al U.S. Pat. No. 4,463,368. It is apparent from curves 40 and 42 that the electric field profile for these APD's only provides for multiplication in the vicinity of the p-n junction. While an APD having the electric field profile of curve 42 exhibits a lower $k_{eff}$ than the normal APD having the electrical profile of curve 40 multiplication in this low-$k_{eff}$ APD occurs within about 8 μm of the p-n junction of the APD and is not spread across the active region of the APD.

Curve 44 represents the electric field profile for the lower $k_{eff}$ APD as made in accordance with the teachings of the present invention. The electric field profile peaks adjacent the p-n junction in a value in the order of about $2.9 \times 10^5$ volts/cm. The electric field profile diminishes over the distance that the p-type conductivity region extends into the APD but remains at a value sufficient to maintain multiplication throughout the thickness of the APD. This latter value is about $1.6 \times 10^5$ volts/cm. The calculated breakdown voltages range from about 300 volts for a device 15 μm thick to about 700 volts for a device 40 μm thick.

Figure 4:
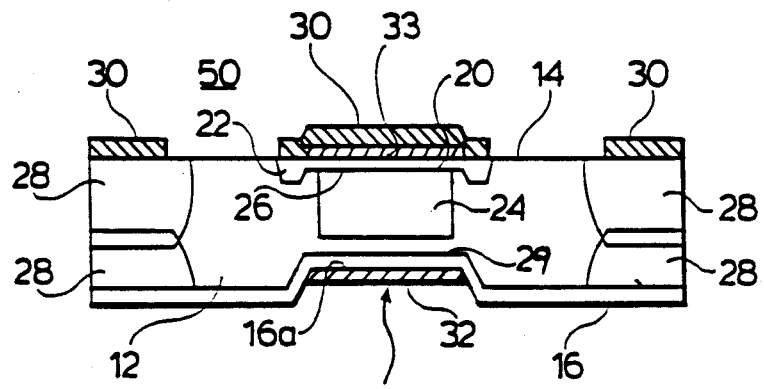

FIG. 4 illustrates an alternate embodiment for the APD structure of the present invention. Identification of the common elements of the APD 50 and the APD 10 of FIG. 1 is the same. In this embodiment the channel-stops 28 are used to connect the opposing surfaces 14 and 16, allowing for co-planar (i.e. single-sided) contacting of the device whereby no contacts are required on the light entry side (surface portion 16a) of the APD 50. Another alternative embodiment would be to provide an APD having a total thickness equal to the thickness of the APD at the active region of the device. However, in this embodiment, some multiplication in the guard ring region would be expected and hence the depth of the guard ring would have to carefully controlled to prevent the edge breakdown.

In FIG. 1, the central active region of APD 10 has been formed by thinning the device in two steps. It is important for the satisfactory operation of this device that the active region be of uniform thickness, and experience has shown that this requirement is sometimes more easily satisfied using a two step thinning process rather than a single step. However, the device should function with either a single step thinning process if the wafer has been thinned everywhere to the thickness substantially equal to the thickness of the APD across its active region.

The method of making the improved APD 10 or 50 includes the step of preparing a body 12 of π-type Si, typically having a resistivity of about 3,000 ohm-cm or greater, having two opposed surfaces 14 and 16 which may have any crystallographic orientation but are preferably (100) crystallographic planes and typically being between about 100 and 125 μm thick. The p-type region 24 is formed by masking of the surface 14 with a material such as SiO$_2$, and then introducing an acceptor such as boron, preferably by ion implantation, through an opening in the mask in an amount corresponding to between about $1 \times 10^{12}$ and about $2.5 \times 10^{12}$ acceptors/cm$^2$, and preferably between about $1.4 \times 10^{12}$ and about $1.8 \times 10^{12}$ acceptors/cm$^2$ of surface area implanted. The boron is then diffused into the body typically at a temperature between about 1150° C. and 1200° C. for a time such that the diffusion length $L_a$ is between 2 μm and 10 μm and preferably between 4 μm and 6 μm. The depth of the p-type region 24 is that depth at which the local concentration of acceptors added is equal to the background concentration of acceptors. For the concentrations being considered, the depth is about 5 times $L_a$.

In the completed device about one-half to two-thirds of the implanted acceptors remain in the Si body, the remainder being lost to the different oxides and glasses which overlie the first surface during fabrication. The p-type region 24 contains an uncompensated excess concentration of the acceptors corresponding to a dose of between about $5 \times 10^{11}$ and $10^{12}$ of surface area through which the acceptors enter the body.

The p$^+$-type channel-stop region 28 is typically formed by diffusion of boron from a deposited or implanted source, and is typically diffused simultaneously with the p-type region 24. The diffusion source is chosen to yield a surface concentration typically in excess of 10E18/cm$^3$. In the second embodiment of the invention, shown in FIG. 4, the two p$^+$ regions are typically both diffused simultaneously with the p-type region 24.

The n$^+$-type regions 20 and 22 are then formed by introducing a donor, such as phosphorus, arsenic or antimony, into the same surface of the body 12. Typically, the n$^+$-type region is formed by suitable masking and prediffusion of phosphorus into the surface from a phosphorus-doped glass (PDG) deposited in an opening in the mask. The guard ring region 22 is formed first, since its diffusion depth is intentionally greater than the central region 20. The guard ring region 22 is diffused typically for a time of 2 hours at 1050° C. The glass is then stripped from the surface, the surface recoated with silicon dioxide, re-photoresisted to open the central region 20, and re-diffused with phosphorus from a phosphorus-doped glass such that a p-n junction with the diffused p-type region 24 is formed at a distance less than about 2 μm from the surface 14. The phosphorus diffusion of region 20 is typically carried out at 1000° C. for between about 10 and 30 minutes.

The electrical contact 30 to the p$^+$-type region 28 is typically formed by masking and sequential deposition of Cr and Au layers. The electrical contacts 33 and 34 made to the n$^+$-type regions 20 and 22 are formed by appropriate masking of the surface 14 followed by sequential vacuum deposition of Al, Cr and Au.

The antireflection coating 32 consists of one or more layers of transparent materials having different indices of refraction and is typically formed by deposition of a SiO layer having an optical thickness of ¼ of the wavelength of light for which the avalanche photodiode is optimized.

The well 18 in the surface 16 of the photodiode 50 is formed by masking the surface of the body and etching the surface 16 through an opening in the mask to the desired depth using a chemical etch composed of 30 parts of HNO$_3$:2 HF:1 CH$_3$COOH : 1 H$_2$O by volume.

This involves a two step etching process. The well 18 extends into the body 12 a distance such that thickness of the body in the region of the well is less than about 40 μm.

What I claim as new and desire to secure by Letter Patent of the United States is:

1. An avalanche photodiode comprising:
   a π-type conductivity silicon body having an active region extending between a pair of opposed first and second major surfaces;
   an n-type conductivity central region extending a distance of about 1 to 2 μm into the body from a portion of a first major surface thereof;
   an n-type conductivity guard ring surrounding the central region and extending into the body a distance greater than that of the distance the central region extends into the body;
   a p-type conductivity region contacting the n-type region, extending into the body a distance of about 10 to 50 μm, and containing acceptors in an uncompensated, excess concentration corresponding to a net dose of between about $5 \times 10^{11}$ and $10^{12}$/cm$^2$ of surface area through which the acceptors enter the body such that the silicon body has an electric field profile having multiplication spread substantially throughout the active region of the body with the electric field remaining above about $1.6 \times 10^5$ volts/cm at room temperature; and
   a p$^+$-type conductivity region extending a distance into the body from the second major surface opposite to the first surface.

2. The avalanche photodiode of claim 1 wherein the guard ring extends about 5 to 10 μm into the body.

3. The avalanche photodiode of claim 1 including first and second electrical contacts respectively overlying portions of the n-type conductivity region and the p$^+$-type conductivity region, respectively.

4. The avalanche photodiode of claim 3 wherein the first electrical contact comprises a first metal providing a reflector and a second multi-layer metal overlying the first metal to which leads may be bonded.

5. The avalanche photodiode of claim 4 wherein the first metal is aluminum, the first layer of the second multi-layer metal is chrome and the second layer of the second multi-layer metal is gold.

6. The avalanche photodiode of claim 1 wherein the thickness of the photodiode between the first and second opposing major surfaces through the active region of the APD is less than 40 μm and the p-type conductivity region extends between 20 and 30 μm into body.

7. The avalanche photodiode of claim 6 wherein the thickness of the photodiode is between 15 and 30 μm.

8. The avalanche photodiode of claim 1 wherein the second major surface includes a well adjacent the p-type conductivity region such that the thickness of the photodiode at the well is less than 40 μm.

9. The avalanche photodiode of claim 8 wherein the thickness of the photodiode at the well is between 15 and 30 μm.

10. The avalanche photodiode of claim 1 wherein the p-type conductivity region has a doping concentration of the form:

$$N_a(x) = N_{ao} + \frac{n_{ai}\exp[-x^2/4L_a^2]}{\pi^{\frac{1}{2}}L_a}$$

where $N_{ao}$ is the net ionized impurity doping level of the starting material and is in the order of about 2 to $5 \times 10^{12}/cm^3$, $n_{ai}$ is the net implanted concentration dose, and $L_a$ is the average diffusion length of the implanted acceptor impurity into the body and is between about 2 and $10 \times 10^{-4}$ cm.

11. The avalanche photodiode of claim 10 wherein $n_{ai}$ is about 7 to $9 \times 10^{11}/cm^2$.

12. The avalanche photodiode of claim 1 further including p+ conductivity channel stops diffused into the body from the first surface thereof adjacent to and spaced from the guard ring.

13. The avalanche photodiode of claim 12 wherein the channel stops are diffused through the photodiode and coplanar metal contacts are located on the first major surface of the photodiode.

14. An avalanche photodiode comprising:
a $\pi$-type conductivity silicon body having an active region extending between a pair of opposed major surfaces;
an n-type conductivity central region extending into the body from a portion of a first major surface thereof and contacting a p-type conductivity region to form an abrupt p-n junction about 1 to 2 $\mu$m into the body,
an n-type conductivity guard ring surrounding the n-type central region and extending a distance beyond the distance that the central region extends into the body to prevent edge breakdown at the p-n junction;
the p-type conductivity region containing acceptors in an uncompensated, excess doping concentration of the form:

$$N_a(x) = N_{ao} + \frac{n_{ai}\exp[-x^2/4L_a^2]}{\pi^{\frac{1}{2}}L_a}$$

where $N_{ao}$ is the net ionized impurity doping level of the starting material and is in the order of about 2 to $5 \times 10^{12}/cm^3$, $n_{ai}$ is the net concentration dose and is about 5 to $10 \times 10^{11}/cm^2$ of surface area through which the acceptors enter the body, and $L_a$ is the average diffusion length of the implanted acceptor impurity into the body and is between about 4 and 6 $\mu$m such that the silicon body has an electric field profile having multiplication spread substantially throughout the active region of the body with the electric field remaining above about $1.6 \times 10^5$ volts/cm at room temperature; and
a p+-type conductivity region extending a distance into the body from the second major surface opposite to the first surface.

15. The avalanche photodiode of claim 14 wherein $n_{ai}$ is about 7 to $9 \times 10^{11}/cm^2$.

16. The avalanche photodiode of claim 14 wherein the guard ring extends about 5 to 10 $\mu$m into the body.

17. The avalanche photodiode of claim 14 wherein the thickness of the photodiode between the first and second opposing major surfaces through the active region of the APD is less than 40 $\mu$m.

18. The avalanche photodiode of claim 17 wherein the thickness of the photodiode is between 15 and 30 $\mu$m.

19. The avalanche photodiode of claim 15 wherein the second major surface includes a well adjacent the p-type conductivity region such that the thickness of the photodiode at the well is less than 40 $\mu$m.

20. The avalanche photodiode of claim 15 wherein the thickness of the photodiode at the well is between 15 and 30 $\mu$m.

21. The avalanche photodiode of claim 14 further including p+ conductivity channel stops diffused into the body from the first surface thereof adjacent to and spaced from the guard ring.

22. The avalanche photodiode of claim 21 wherein the channel stops are diffused through the photodiode and coplanar metal contacts are located on the first major surface of the photodiode.

* * * * *